United States Patent [19]
Cole, Jr.

[11] Patent Number: 6,078,183
[45] Date of Patent: Jun. 20, 2000

[54] THERMALLY-INDUCED VOLTAGE ALTERATION FOR INTEGRATED CIRCUIT ANALYSIS

[75] Inventor: Edward I. Cole, Jr., Albuquerque, N.Mex.

[73] Assignee: Sandia Corporation, Albuquerque, N.Mex.

[21] Appl. No.: 09/034,546

[22] Filed: Mar. 3, 1998

[51] Int. Cl.$^7$ .................................................. G01R 31/02
[52] U.S. Cl. .......................................... 324/752; 324/765
[58] Field of Search ................................. 324/158.1, 73.1, 324/750, 752, 765, 500, 537; 250/559.07, 309, 396; 382/8

[56] References Cited

U.S. PATENT DOCUMENTS

| | | | |
|---|---|---|---|
| 5,422,498 | 6/1995 | Nikawa | 257/48 |
| 5,430,305 | 7/1995 | Cole, Jr. | 250/559.07 |
| 5,708,371 | 1/1998 | Koyama | 324/752 |
| 5,844,416 | 12/1998 | Campbell et al. | 324/750 |

OTHER PUBLICATIONS

T. Koyama, Y. Mashiko, M. Sekine, H. Koyama and K. Horie, "New Non–Bias Optical Beam Induced Current (NB–OBIC) Technique for Evaluation of Al Interconnects," Proceedings of the International Reliability Physics Symposium, pp. 228–233, 1995. (Month unavailable).
K. Nikawa and S. Inoue, "Various Contrasts Identifiable From the Backside of a Chip by 1.3 μm Laser Beam Scanning and Current Change Imaging," Proceedings of the 22nd International Symposium for Testing and Failure Analysis, pp. 387–392, Nov. 18, 1996.
S. Ferrier, "Thermal and Optical Enhancements to Liquid Crystal Hot Spot Detection Methods," Proceedings of the 23rd International Symposium for Testing and Failure Analysis, pp. 57–62, Oct. 27, 1997.
K. Nikawa and S. Inoue, "Detection and Characterization of Failures and Defecte in LSI Chips by Optical Beam Induced Resistance Changes (OBIRCH), " Presented at DRIP 97, Berlin, Germany, Sep. 7, 1997.
K. Nikawa and S. Inoue, "New Capabilities of OBIRCH Method for Fault Localization and Defect Detection,"Presented at the Sixth Asian Test Symposium (ATS '97), Akita, Japan, Nov. 17–19, 1997.

*Primary Examiner*—Vinh P. Nguyen
*Attorney, Agent, or Firm*—John P. Hohimer

[57] ABSTRACT

A thermally-induced voltage alteration (TIVA) apparatus and method are disclosed for analyzing an integrated circuit (IC) either from a device side of the IC or through the IC substrate to locate any open-circuit or short-circuit defects therein. The TIVA apparatus uses constant-current biasing of the IC while scanning a focused laser beam over electrical conductors (i.e. a patterned metallization) in the IC to produce localized heating of the conductors. This localized heating produces a thermoelectric potential due to the Seebeck effect in any conductors with open-circuit defects and a resistance change in any conductors with short-circuit defects, both of which alter the power demand by the IC and thereby change the voltage of a source or power supply providing the constant-current biasing. By measuring the change in the supply voltage and the position of the focused and scanned laser beam over time, any open-circuit or short-circuit defects in the IC can be located and imaged. The TIVA apparatus can be formed in part from a scanning optical microscope, and has applications for qualification testing or failure analysis of ICs.

40 Claims, 10 Drawing Sheets

THERMALLY-INDUCED VOLTAGE ALTERATION FOR INTEGRATED CIRCUIT ANALYSIS

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates generally to failure analysis and qualification testing of integrated circuits (ICs), and specifically to an apparatus and method for analyzing an IC for any open-circuit or short-circuit defects therein based on localized heating of electrical conductors within the IC by a focused and scanned laser beam while the IC is biased at a constant current.

BACKGROUND OF THE INVENTION

Open-circuit and short-circuit defects in electrical conductors within integrated circuits (ICs) can result in major IC yield and reliability problems. A capability for localizing and identifying these types of defects is important for analyzing ICs to determine failure mechanisms therein, for qualifying ICs as known-good devices, and for implementing corrective action during IC fabrication to minimize the occurrence of such defects. Efficient and reliable detection for open-circuit and short-circuit defects will become of increasing importance as the number of interconnection levels and the length of interconnections increase with the development of new generations of ICs.

Present ICs generally employ multiple levels of patterned metallization that can obscure lower electrical conductor levels, thereby complicating failure analysis or qualification testing from a device side of the IC whereon the levels of patterned metallization are formed. Additionally, flip-chip packaging makes device-side analysis difficult if not impossible. As a result, there is a need for the development of analysis methods that can operate on both a device-side and a substrate-side of the ICs to be tested, thereby facilitating the detection of any open-circuit and short-circuit defects in the ICs.

Unfortunately, presently available substrate-side analysis methods are not totally effective in localizing open and shorted conductors. Furthermore, the presently available methods can be time consuming; they can yield a great deal of superfluous information; and they can provide only indirect evidence of open-circuit and short-circuit defects. What is needed is a rapid, sensitive method for analyzing ICs for open-circuit and short-circuit defects that operates under any IC mounting configuration.

An advantage of the apparatus and method of the present invention is that a high sensitivity for analyzing an IC for any open-circuit and short-circuit defects therein can be realized by biasing the IC with a constant-current source and measuring a change in a variable voltage of the source in response to a change in power demand by the IC produced upon irradiating a particular defect with a focused and scanned laser beam.

Another advantage of the apparatus and method of the present invention is that any open-circuit or short-circuit defects can be located within an IC from either a device side or a substrate side of the IC.

A further advantage of the apparatus and method of the present invention is that the change in voltage of the constant-current source produced by irradiation of an open-circuit or short-circuit defect within the IC by a focused and scanned laser beam can be orders of magnitude larger than any localized change in current, voltage or resistance within the IC at the location of the defect.

Still another advantage of the present invention is that an entire IC die can be examined in a single image to locate any open-circuit or short-circuit defects therein.

Yet another advantage of the present invention is that it is nondestructive and can be used for qualification testing of ICs to locate any open-circuit or short-circuit defects therein.

These and other advantages of the method of the present invention will become evident to those skilled in the art.

SUMMARY OF THE INVENTION

The present invention relates to a thermally-induced voltage alteration (TIVA) apparatus and method for analyzing an integrated circuit (IC) for any open-circuit or short-circuit defects therein. The TIVA apparatus comprises a constant-current source connected to the IC to supply a constant current and a variable voltage to the IC, with the variable voltage changing in response to a change in power demand by the IC; a laser producing a beam with a photon energy less than a bandgap energy of a semiconductor substrate whereon the IC is formed; means, such as a scanning optical microscope, for focusing and scanning the laser beam to irradiate electrical conductors within the IC, thereby changing the power demand by the IC when the laser beam irradiates any open-circuit or short-circuit defect in the IC; and display means, comprising inputs of the changing voltage and a laser-beam position signal from the focusing and scanning means, for indicating the location of each open-circuit or short-circuit defect in the IC.

The TIVA apparatus can further comprise a stage for holding the IC, with the stage preferably providing a plurality of electrical connections to the IC and optionally comprising means for heating or cooling the IC. Additionally, the TIVA apparatus include a switch matrix connected to the IC for controlling the electrical connections to the IC (e.g. for providing a vector set of voltage inputs to the IC for toggling the IC between logic states thereof). The TIVA apparatus can also comprise an amplifier connected between the constant-current source and the display means to amplify the changing voltage, thereby permitting an increased sensitivity for detection of any open-circuit or short-circuit defects in the IC. Finally, the TIVA apparatus can comprise a photodetector for detecting a portion of the laser beam reflected or scattered from the IC to generate a reflected-light image of the IC to aid in locating the defects within the IC.

The laser beam in the TIVA apparatus has a photon energy of less than 1.1 electron volts (eV), and a wavelength that is preferably in the range of about 1.2 microns to 2.5 microns. Such laser beam can be produced, for example, by a neodymium laser such as a neodymium:yttrium-vanadium-oxide laser operating at a wavelength of 1.34 microns ($\mu$m), or by a neodymium:yttrium-aluminum-garnet laser operating at a wavelength of 1.32 $\mu$m. The laser beam can be directed to irradiate the electrical conductors from a device side of the IC to analyze ICs mounted with the device side up; or alternately, the laser beam can be transmitted through the semiconductor substrate for irradiating the electrical conductors from a substrate-side of the IC to analyze ICs mounted in a flip-chip arrangement. Finally, an optical filter can be placed in a path of the laser beam, if needed, to remove any light having a photon energy equal to or greater than the bandgap energy of the semiconductor substrate and thereby eliminate spurious signals that might otherwise be produced by photogenerated free electron-hole pairs at semiconductor interfaces or junctions within the IC.

The method of the present invention for analyzing an IC comprises steps for: supplying electrical power to the IC from a source having a constant current and a variable voltage that changes in response to a change in a power demand by the IC; irradiating electrical conductors within the IC by focusing and scanning a laser beam over a portion of the IC, with the laser beam having a photon energy less than a bandgap energy of a semiconductor substrate wherefrom the IC is formed; and detecting any open-circuit or short-circuit defects within the IC by sensing a position of the focused and scanned laser beam and a change in the variable voltage from the constant-current source. The detecting step can further comprise forming an image of the defects within the IC. Additionally, steps can be provided for forming a reflected-light image of the IC, and superposing the reflected-light image with the image of the defects, thereby forming a composite image to aid in locating the defects within the IC. Furthermore, a step can be provided for holding the IC and making a plurality of electrical connections thereto. Finally, a step can be provided for amplifying the change in the variable voltage prior to the detecting step, thereby increasing a sensitivity for detecting the open-circuit or short-circuit defects.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings:

FIG. 6a shows a magnified and rotated image of the open-circuit defect of FIG. 5a.

FIG. 8a shows an enlarged TIVA image of the portion of the SRAM IC immediately surrounding the short-circuit defect in FIG. 7a.

DETAILED DESCRIPTION OF THE INVENTION

Figure 1:
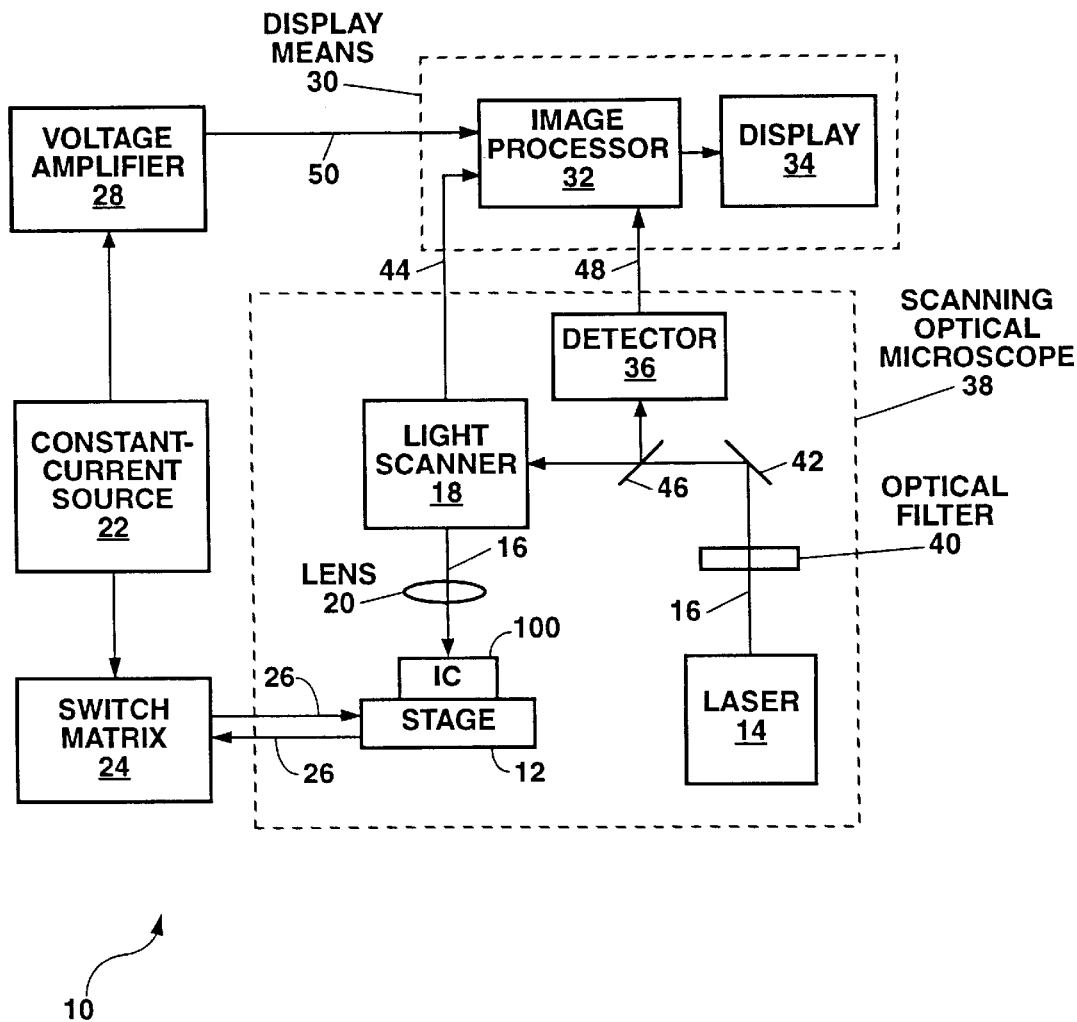
FIG. 1 shows a schematic representation of an embodiment of the thermally-induced voltage alteration (TIVA) apparatus of the present invention.

Referring to FIG. 1, there is shown schematically an embodiment of the thermally-induced voltage alteration (TIVA) apparatus 10 of the present invention. The TIVA apparatus 10 comprises a stage 12 for holding at least one IC 100 to be tested; a laser 14 producing a light beam 16 which is directed through a light scanner 18 and focused by a lens 20 to irradiate a predetermined portion of the IC 100; and a constant-current source or power supply 22 connected to power the IC 100 via a switch matrix 24 and electrical connections 26. In FIG. 1, the TIVA apparatus 10 further comprises a voltage amplifier 28 connected between the constant-current source 22 and a display means 30, with the display means 30 further comprising an image processor 32 and a display 34. A detector 36 also provides an output to the display means 30 to generate a reflected-light image of the portion of the IC 100 being irradiated.

The TIVA apparatus 10 in FIG. 1 can comprise a scanning optical microscope (SOM) 38 which can include elements of the present invention shown within the large dashed box, including the stage 12, the light scanner 18, the focusing lens 20 (e.g. an objective lens) and the photodetector 36. The laser 14 can either be included within the SOM 38 as shown in FIG. 1, or can be located outside and separate from the SOM 38 (e.g. with fiber optic coupling). The scanning optical microscope 38 can further include an eyepiece or video camera (not shown) for visually identifying a portion of the IC 100 to be analyzed with the TIVA apparatus 10.

For use of the TIVA apparatus 10, at least one IC 100 to be analyzed is placed on the stage 12 with a plurality of electrical connections 26 being made to and from the IC 100 including a constant current, $I_{DD}$, and a variable voltage, $V_{DD}$, from the source 22. The stage 12 can optionally be heated or cooled to maintain the IC 100 at a predetermined temperature. The stage 12 can be heated, for example, with an electrical resistance heating element or a thermoelectric module; whereas cooling of the stage 12 can be performed, for example, with a refrigeration system or with a thermoelectric module.

In FIG. 1, the electrical connections 26 can be routed to the IC 100 through the stage 12, or alternately the connections 26 can be made directly to the IC 100. The IC 100 to be tested can be in wafer form (i.e. a plurality of ICs on a common semiconductor substrate), in die form (i.e. a single unpackaged IC), or in packaged form. For analysis of a completely packaged IC 100, a portion of the IC package can be removed (e.g. by lid removal or mechanical polishing) to expose a particular side of the IC for optical access by the focused and scanned laser beam 16. The term "analysis" as used herein is intended to refer to both failure analysis and qualification testing.

If the IC 100 to be tested is mounted on a chip-carrier or package with a device side (defined herein as a side of a semiconductor substrate whereon a plurality of transistors are formed and interconnected by the electrical conductors to form the IC 100) of the IC exposed, then the TIVA apparatus 10 will generally be used to initially irradiate the device side of the IC 100 for analysis. In performing failure analysis on a known-bad IC 100, if no open-circuit or short-circuit defects are found using device-side irradiation, the device side of the IC 100 can be potted in epoxy so that the IC package can be mechanically polished to expose a substrate side (defined herein as the other side of the IC 100 which is generally featureless) of the IC. A substrate-side analysis of the IC 100 can then be performed with the TIVA apparatus 10 by transmitting the focused and scanned laser beam 16 through the semiconductor substrate to irradiate the electrical conductors in the IC 100 in order to locate the defect. The use of a substrate-side analysis is particularly advantageous when the defect is located in a buried electrical conductor (i.e. a conductor buried below one or more levels of metallization) which is optically inaccessible from the device side of the IC 100.

Similarly, if the IC 100 being tested is mounted in a flip-chip arrangement with the substrate side of the IC 100 exposed, then the TIVA apparatus 10 can be used with the laser beam 16 transmitted through the semiconductor substrate to irradiate the electrical conductors in the IC 100 for analysis thereof. If needed, the substrate side of the flip-chip-mounted IC 100 can be polished reduce scattering of the incident laser beam 16 (e.g. when the IC substrate has a rough or unpolished surface). Additionally, the substrate side of the IC 100 can be thinned to reduce an absorption of the laser beam 16 (e.g. for a heavily doped semiconductor substrate providing a substantial absorption of the laser beam 16).

The constant-current source 22 in FIG. 1 is operated in a constant-current mode to provide a predetermined current generally in the microampere ($\mu$A) to milliampere (mA) range depending upon a particular type of IC 100 to be tested. The constant-current source 22 further provides a variable supply voltage generally in the range of about 1–9 volts, and preferably in the range of 3.3–5 volts for a complementary-metal-oxide-semiconductor (CMOS) IC 100. An example of a constant-current source 22 that can be used for practice of the present invention is a Keithley Instruments, Model 238 Source Measurement Unit which is computer controllable.

In FIG. 1, the constant-current source 22 is routed through a switch matrix 24 (e.g. a digital tester) to the IC 100 under test. This arrangement allows the electrical connections 26 to the IC 100 to be controlled and reconfigured as necessary, including toggling the IC 100 between a plurality of logic states therein using a set of predetermined test vectors. Toggling of various logic states in the IC 100 can be important since any electrical conductors having open-circuit or short-circuit defects therein can only be located with the TIVA apparatus 10 when the focused and scanned laser beam 16 produces a localized heating that alters the power demand by the IC 100. Thus, the electrical conductor having an open-circuit or short-circuit defect therein must be operationally connected to a transistor or other element in the IC 100 that is drawing electrical power from the constant-current source 22 in order for the TIVA apparatus 10 to locate the defect within that electrical conductor. In FIG. 1, control of the switch matrix 24 can be performed either manually or with a computer.

The laser 14 in FIG. 1 provides a beam 16 having a photon energy that is less than a bandgap energy of the semiconductor substrate wherefrom the IC 100 is formed so that the beam 16 does not produce photogenerated free electron-hole pairs at semiconductor interfaces or junctions within the IC 100. According to the present invention, electrical connections in the IC 100 are to be analyzed for any open-circuit or short-circuit defects therein; and any effect occurring at semiconductor interfaces or junctions due to photogenerated free electron-hole pairs can result in the generation of spurious signals that can complicate analysis of the IC 100. For a silicon substrate, the photon energy is preferably less than 1.1 electron volts (eV), and for a gallium arsenide (GaAs) substrate, the photon energy is preferably less than 1.4 eV.

The wavelength of the laser beam 16 is inversely related to photon energy so that the wavelength of the laser beam 16 is greater than about 1.2 $\mu$m for a silicon substrate. For device-side irradiation of an IC 100 formed on a silicon substrate, any laser 14 that produces a beam 16 with a wavelength $\geq$1.2 $\mu$m can be used for practice of the present invention.

Figure 2:
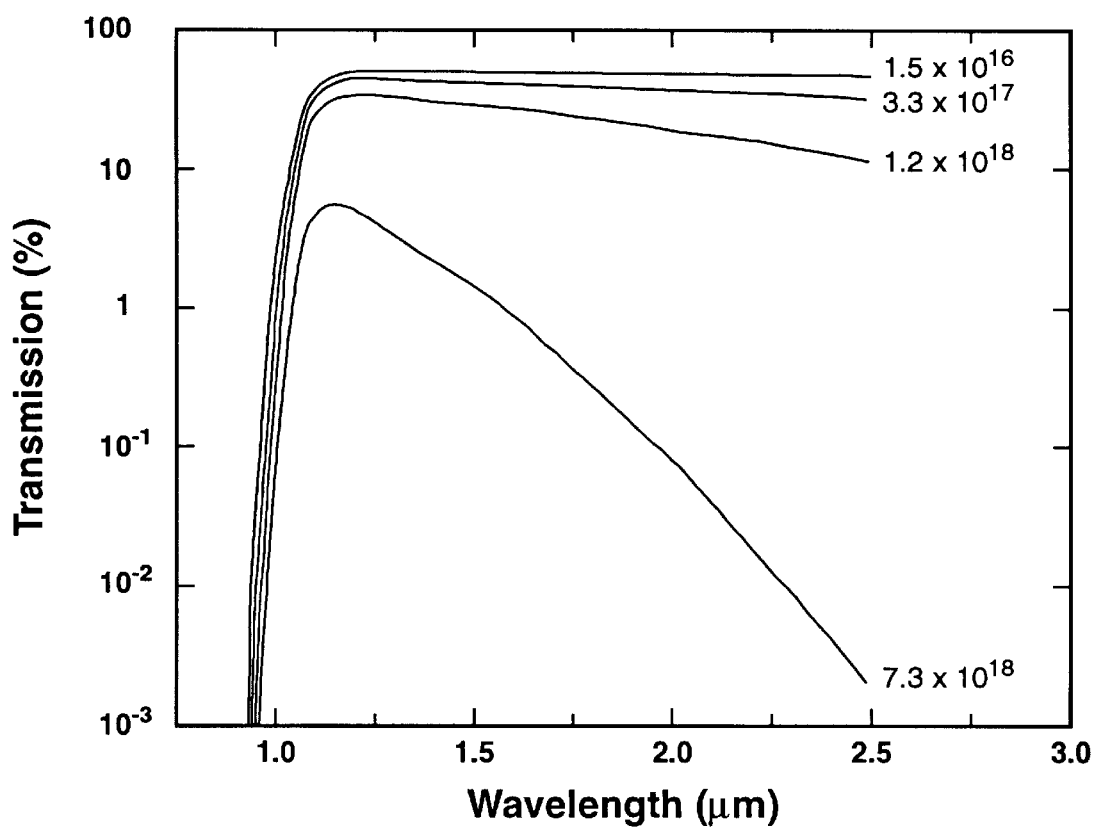
FIG. 2 shows transmission curves over a wavelength range of about 1.0–2.5 $\mu$m for 625-$\mu$m-thick silicon substrates having various p-type dopant concentrations from $1.5 \times 10^{16}$ cm$^{-3}$ to $7.3 \times 10^{18}$ cm$^{-3}$.

For substrate-side irradiation of the IC 100, the transmission through the semiconductor substrate must be considered since this will affect a power level of the laser beam 16 for irradiating the electrical conductors in the IC 100. Transmission through the IC substrate will depend upon the semiconductor composition of the substrate (e.g. Si or GaAs), and also on a doping type (i.e. n- or p-type doping) and dopant concentration of the substrate. As an example, FIG. 2 shows transmission curves over a wavelength range of about 1.0–2.5 $\mu$m for 625-$\mu$m-thick silicon substrates having various p-type dopant concentrations (in $cm^{-3}$). At low dopant concentrations, the laser 14 can have a wavelength in the range of about 1.2–2.5 $\mu$m; whereas, as the p-type dopant concentration is increased, a preferred wavelength range for maximum transmission of the laser beam 16 is reduced on the long-wavelength side (i.e. wavelengths nearer to 1.2 $\mu$m are to be preferred to produce a maximum localized heating effect within the electrical conductors).

A particular type of laser 14 that can be used for practice of the present invention is a neodymium laser, such as a neodymium:yttrium-vanadium-oxide (Nd:YVO$_4$) laser operating at a wavelength of 1.34 $\mu$m, or a neodymium:yttrium-aluminum-garnet (Nd:YAG) laser operating at a wavelength of 1.32 $\mu$m. Lasing of these neodymium lasers 14 at wavelengths less than or equal to the bandgap of the semiconductor substrate (i.e. at photon energies greater than or equal to the bandgap energy) is disadvantageous and can be avoided by using an optical filter 40 (e.g. a long-wavelength pass filter) in the path of the light beam 16 (or alternately using narrow-bandwidth cavity mirrors in the laser 14 to limit operation to wavelengths in the range of about 1.2–2.5 $\mu$m). The use of an optical filter 40 in the path of the laser beam 16 can be especially advantageous when the laser 14 emits at multiple lasing wavelengths with one or more of the wavelengths being sufficiently close to or above the bandgap energy of the semiconductor substrate or transistors formed therein to produce photogenerated free electron-hole pairs which result in spurious images that can complicate the analysis of the IC 100.

In FIG. 1, the laser 14 preferably operates in a single transverse mode for optimal focusing of the laser beam 16. The laser 14 can operate either in a continuous-wave (cw) mode, or in a pulsed mode, with an output power from about 100 milliwatts (mW) to a few hundred mW depending on a focused spot size of the laser beam 16 and whether the irradiation of the electrical conductors is from the device side or the substrate side of the IC 100.

In FIG. 1, the laser beam 16 is directed from the laser 14 by one or more mirrors 42 into the light scanner 18 which scans the focused light beam 16 over a predetermined portion of the IC 100. The light scanner 18 can comprise a pair of galvanometer-driven mirrors in an x-y arrangement and an output position signal 44 that indicates an x-y position of the focused laser beam 16 on the portion of the IC 100 being scanned. The application of electrical driving signals to these galvanometer-driven mirrors can be used to generate a raster scan over the entire portion of the IC 100 to be analyzed, or mask layout information can be provided to a computer and used to generate a scan of the focused laser beam 16 that is confined to the electrical conductors within the IC 100. The scan of the focused laser beam 16 can also be continuous or discontinuous (e.g. irradiating discrete pixels to form a 512×512 pixel scan of the portion of the IC 100 being analyzed). Finally, the focused laser beam 16 can be repetitively scanned over each line of of a continuously-scanned image or stopped at each pixel of a discontinuously-scanned image to provide for signal averaging to improve a signal-to-noise ratio in the generated image for identification of the open-circuit or short-circuit defects in the IC 100.

The scannable light beam 16 is focused by lens 20 (or alternately by one or more curved mirrors) to a predetermined spot size that is generally on the order of the width of the electrical conductors in the IC 100 for optimally heating the conductors. The focused laser beam spot can range in size from a wavelength of the light (i.e. 1.3 $\mu$m) to a few microns depending upon the type of IC 100 to be analyzed and the width of the conductors therein.

In FIG. 1, a reflected-light image of features in the IC 100 can be generated by collecting and detecting a portion of the incident laser beam 16 that is reflected or scattered from the features in the IC 100. The reflected or scattered light can be collected with the lens 20 in FIG. 1 and conveyed back along the laser-beam path to a partially-reflecting mirror 46 and therefrom to a detector 36 (e.g. a germanium photodetector). The detector 36 produces a reflected-light signal 48 that can be sensed by the display means 30 in combination with the laser-beam position signal 44 to generate the reflected-light image of the IC 100. The provision of a reflected-light image in the TIVA apparatus 10 is advantageous for focusing the laser beam 16 at a plane of the electrical conductors to be examined, and for precisely locating any defects in the IC 100 that have been identified with the TIVA apparatus 10. A reflected-light image can be formed with irradiation of the IC 100 from either the device side or the substrate side. In general, the resolution of the reflected-light image will depend upon the size of the focused laser beam 16. Additionally, polishing of the substrate side can be advantageous for improving the quality of the reflected-light image when this mode of irradiation is selected.

In the present invention, different mechanisms are used to detect open-circuit and short-circuit defects as described hereinafter. In each case, the scanned laser beam 16 is used to produce localized thermal gradients (i.e. localized heating) within the electrical conductors, or within a short-circuit between adjacent electrical conductors. The effects of the thermal gradients on IC power consumption (i.e. power demand) are detected by monitoring voltage fluctuations of the constant-current source 22 with the IC 100 biased at a predetermined constant current. Open-circuit electrical conductors (defined herein as an electrically conducting pathway whose ability to transfer electrical signals from one part of an IC to another part of the IC has been compromised by one or more failure mechanisms such as stress voiding, electromigration, silicon migration into a metal conductor, a design defect, or a processing defect) are detected using the Seebeck Effect to change the power demand by the IC 100; whereas short-circuit conductors are detected by a resistance change in a short-circuit conducting pathway that alters the power demand by the IC 100. Since the current being supplied to the IC 100 is kept constant, any change in power demand results in a change in the voltage provided by the constant-current source 22. It is this voltage change that is detected according to the present invention.

In the Seebeck Effect, thermal gradients in electrical conductors generate electrical potential gradients (i.e. voltage gradients) in the same manner that a thermocouple formed by contact between two dissimilar metals when heated produces a thermocouple voltage. An electrical potential produced by localized heating within the electrical conductors has a value on the order of microvolts ($\mu$V) for each °C. of heating. Thermal modeling results for an IC 100 formed on a silicon substrate show that a focused 1.34 $\mu$m-wavelength laser beam 16 will produce about a localized 1° C. change in temperature of the electrical conductor for each milliWatt of laser irradiation. Thus, a 120 mW single-lateral-mode polarized Nd:YVO$_4$ laser producing about 30 mW of laser irradiation (after taking into account transmission losses in the TIVA apparatus 10 and in the IC 100) on an electrical conductor within the IC 100 can produce a localized thermal gradient on the order of 30° C.

In an electrical conductor within the IC 100 that is electrically intact without any defects, any gradient in electrical potential produced by localized heating due to irradiation with the focused laser beam 16 is readily compensated for by a transistor or a power bus that is electrically driving that conductor so that essentially no change in the source voltage occurs. However, if that conductor is electrically isolated from the transistor or power bus, the gradient in electrical potential produced by the localized heating will produce a change in the potential (i.e. voltage) on that conductor. Such change in potential of the open-circuit electrical conductor can affect a bias condition of any transistors whose gates are connected to the conductor, thereby altering a saturation condition and power dissipation of those transistors to produce an amplifying effect which in turn alters the power demand of the IC 100. The change in power demand by the IC 100 can be detected by monitoring the change in voltage of the constant-current source 22, which together with the laser-beam position signal 44 can be used to locate the open-circuit electrical conductor in the IC 100. It should be noted that a change in potential on an open-circuit electrical conductor that does not drive any transistor gates (e.g. an open-circuit power bus) may not change the power demand of the IC 100, and therefore may not be detected with the TIVA apparatus 10.

Localized heating produced by irradiation of an electrical conductor with the focused laser beam 16 can also be used to detect a short-circuit defect responsible for short circuiting of two or more adjacent conductors. A short-circuit defect can increase power demand by the IC 100 being tested when the shorted electrical conductors are at different electrical potentials (e.g. corresponding to logical "0" and "1" states). The IC power demand resulting from the short-circuit defect will depend on the resistance in the short-circuit conducting pathway and its location within the IC 100. As the focused laser beam 16 is scanned over the portion of the IC 100 containing the short-circuit defect, the localized heating of the short-circuit defect proportionally changes the resistance of the defect according to the equation:

$$\rho = \rho_0[1 + \alpha(T - T_0)]$$

where $\rho_0$ is the resistivity of the short-circuit defect at a reference temperature $T_0$ in the absence of any localized heating, T is the temperature of the short-circuit defect produced by localized heating with the focused laser beam 16, and $\alpha$ is a temperature coefficient of resistivity of a metal, metal alloy or semiconductor material forming the short-circuit defect.

The change in resistance of the short-circuit defect upon heating with the focused laser beam 16 results in a change in power demand by the IC 100, thereby resulting in a change in the voltage of the constant-current source 22 which can be detected to locate the short-circuit defect. A short-circuit defect between a pair of adjacent signal lines in the IC 100 generally produces a larger detectable voltage change than does a short-circuit defect between adjacent power buses. This is due to the signal lines being connected to the gate of one or more transistors, thereby changing the bias condition for those transistors and producing an amplifying effect on the power demand by the IC 100 as described heretofore for open-circuit defects.

Using the same IC biasing with the constant-current source 22 and localized heating by the focused and scanned laser beam 16, both open-circuit and short-circuit defects can be identified and located within the IC 100 being tested. Furthermore, the method of the present invention for measuring changes in the supply voltage to the IC 100 with constant-current biasing conditions provides an extremely sensitive method for detecting minute changes in power demand by the IC 100 being tested.

A comparison between measuring a voltage change under constant-current biasing conditions and measuring a current change under constant-voltage biasing conditions in a CMOS IC 100 using the same laser irradiation shows that a much larger change in voltage can be produced under constant-current biasing compared to the change in current produced under constant-voltage biasing. For example, a change in IC power demand that produced a 15 nanoampere (nA) change in current to the IC 100 under constant-voltage biasing was found to produce a 300 millivolt (mV) change in the supply voltage under constant-current biasing. The comparison can be even more dramatic for very-low-power CMOS ICs where a change in IC power demand that produces a 100 picoampere (pA) current change under constant-voltage biasing was found to produce a 2 V change in the supply voltage under constant-current biasing. Thus, the high detection sensitivity provided by the apparatus and method of the present invention using constant-current biasing can produce a detectable voltage change signal when no current change signal is detectable under constant-voltage biasing of the IC 100.

With the TIVA apparatus 10 of the present invention, supply voltage ($V_{DD}$) changes on the order of 0.1 mV are detectable. These small voltage change signals can be further amplified with a voltage amplifier 28 connected between the constant-current source 22 and the display means 30 to provide an amplified voltage signal 50. The voltage amplifier 28 is preferably an alternating-current (a-c) coupled amplifier such as an Ithaco Corporation, Model 1201B voltage amplifier. The voltage amplifier 28 can have a selectable gain of up to $10^3$–$10^4$ for amplifying very small changes in the supply voltage.

In FIG. 1, the display means 30 comprises an image processor 32 and a display 34 (e.g. a cathode ray tube or television monitor). Inputs of the changing voltage (i.e. the voltage change signal from the constant-current source, or the amplified voltage signal 50) and the laser-beam position signal 44 are received into the display means 30 at the image processor 32 to generate an x-y output signal (e.g. a video output signal) for driving the display 34 to form a TIVA image for locating the open-circuit or short-circuit defect. Open-circuit and short-circuit defects can appear as either light or dark spots in the TIVA image, depending on whether the power demand by the IC is increased or decreased by the presence of the defects, thereby increasing or decreasing the voltage provided by the constant-current source 22.

In FIG. 1, a reflected-light signal 48 can also be provided as an input to the image processor 32 to form a reflected-light image of the IC 100 being tested. The image processor 32 can further be used to superpose the TIVA image with the reflected-light image to form a composite image to aid in precisely locating the defects within the IC 100. Additionally, the image processor 32 can provide capabilities for processing and storing the signals 44, 48 and 50, including averaging, contrast enhancing and digitizing the signals. The display means 30 can be a part of the scanning optical microscope 38; or it can be in the form of a separate instrument (e.g. a computer).

A series of examples are provided hereinafter to illustrate the use and capability of the present invention for analyzing different types of ICs 100 for open-circuit or short-circuit defects therein using either device-side or substrate-side irradiation with the focused and scanned laser beam 16.

Figure 3A:
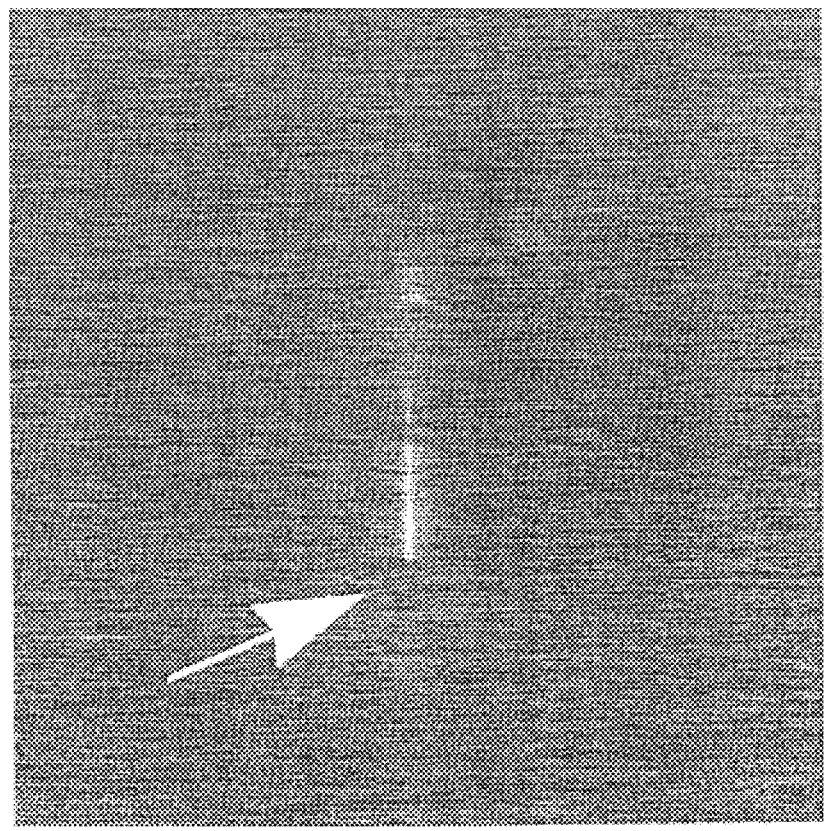
FIG. 3a shows an image of an open-circuit defect in a CMOS IC obtained with the TIVA apparatus of the present invention using device-side laser irradiation.
Figure 3B:
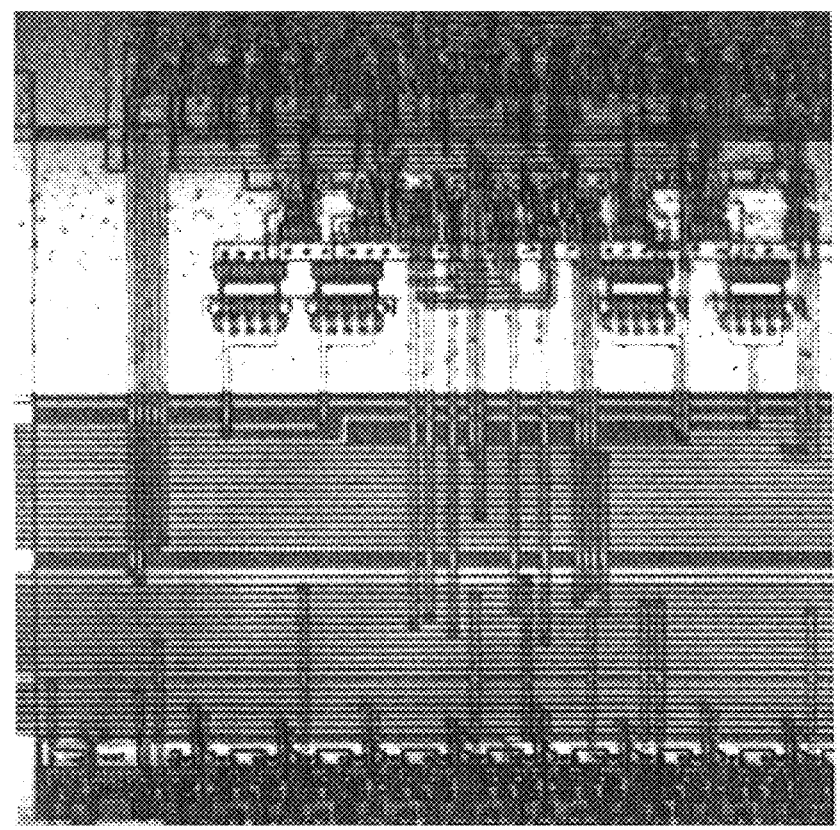
FIG. 3b shows a reflected-light image of the same scanned portion of the IC for registration.

FIGS. 3a and 3b show images obtained with the TIVA apparatus 10 for the device-side analysis of a simulated open-circuit defect in a radiation-hardened CMOS version of an Intel Corporation, Model 80C51 microcontroller fabricated using two levels of patterned conductors (i.e. a two-level metallization) with a 1.25-$\mu$m feature size process. The simulated open-circuit defect in the example of FIGS. 3a and 3b was produced in a second-level metallization using a focused ion beam to locally remove metal from one of the power bus conductors. For analysis, the CMOS IC 100 was biased at a constant current of about 6 mA from the source 22 with the supply voltage being nominally 4.5 V. The laser 14 was operated at 1.34 $\mu$m wavelength with a power output of 120 mW.

FIG. 3a shows the location of the open-circuit defect (indicated by the arrow at the bottom of the light line which indicates the open-circuit electrical conductor) in a portion of the CMOS IC 100 raster scanned by focused laser beam 16. Initially, the entire CMOS IC 100 was scanned with the focused laser beam 16 to locate the open-circuit defect before performing the localized scan of FIGS. 3a and 3b. FIG. 3b shows a reflected-light image of the same portion of the IC for registration with FIG. 3a to precisely locate the open-circuit electrical conductor within the CMOS IC 100. Although FIGS. 3a and 3b are shown separately for clarity, these figures can be superposed by the image processor 32 for display as a composite image to allow a precise location of the open-circuit defect and open-circuit electrical conductor.

Figure 4A:
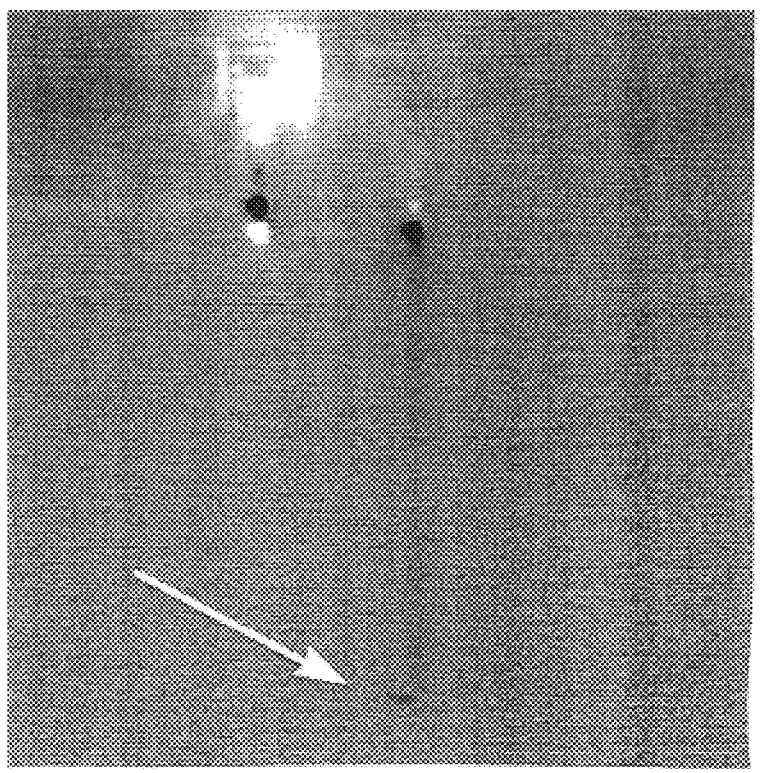
FIGS. 4a and 4b show images obtained from the same IC as in FIGS. 3a and 3b, but with substrate-side analysis using the TIVA apparatus and method of the present invention.
Figure 4B:
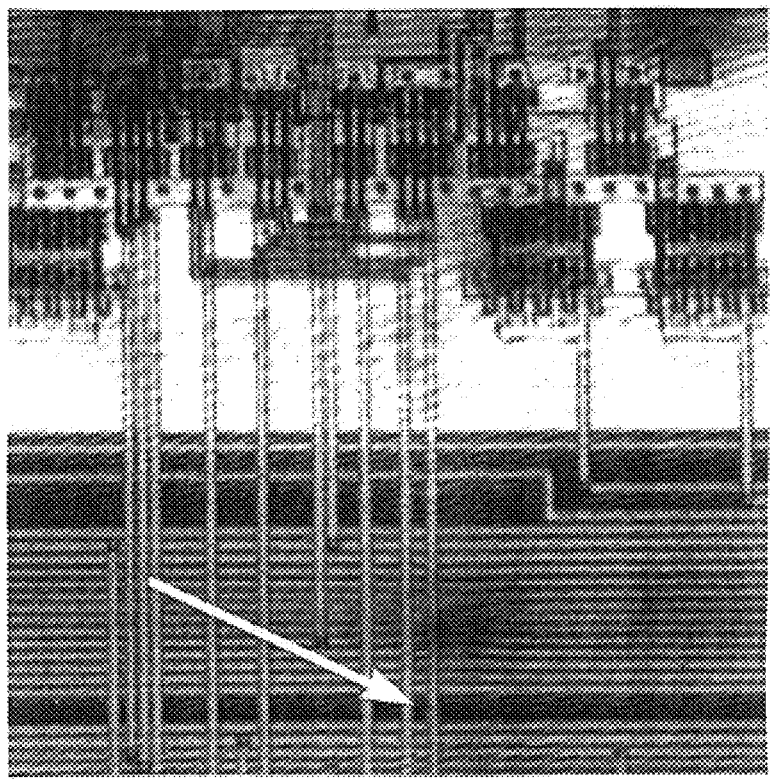

FIGS. 4a and 4b show images obtained from the same IC 100 and simulated open-circuit defect as in FIGS. 3a and 3b using the same operating conditions, but with substrate-side analysis using the TIVA apparatus 10. Since this IC was packaged with the device side exposed (i.e. with the device side up), access to the substrate side of the IC was provided by potting the IC in epoxy and mechanically polishing away the bottom of the IC to expose the substrate side of the IC. Once the substrate-side of the IC 100 was exposed, no additional thinning of the IC substrate was performed.

In FIG. 4a, the open-circuit defect (indicated by the arrow) can be seen. The TIVA image in FIG. 4a was produced by averaging 16 images, with each image being formed by repetitively scanning each line in the image 16 times to improve a signal-to-noise ratio of the image. The signal acquisition time for the 512-line image (with 512 pixels per line) in FIG. 4a was 2048 seconds (16 images averaged×128 seconds/image for for repetitively scanning each line in the image 16 times). At the top of FIG. 4a, a relatively strong image contrast is produced at interconnections between the open-circuited metal conductor and polysilicon electrical conductors, with a dark image being produced at a metal-polysilicon interface, and with a light image being produced by a polysilicon-metal interface. These images are thought to be due to thermocouple effects at the interfaces between the dissimilar materials, with the type of image (i.e. light or dark) that is produced depending on a sign of the thermoelectric potential at each interface (i.e. depending on whether the thermoelectric potential is positive or negative, thereby turning transistors on or off and increasing or decreasing the power demand of the IC 100).

FIG. 4b shows a reflected-light image produced through the IC substrate using the focused and scanned 1.34-$\mu$m laser beam 16 of the TIVA apparatus 10. In FIG. 4b, the location of the open-circuit defect due to a break in the metal conductor is shown by the arrow. Even with relatively poor polishing of the substrate side of the IC 100, the open-circuit defect can be identified by correlating the TIVA image of FIG. 4a with the reflected-light image of FIG. 4b.

Figure 5A:
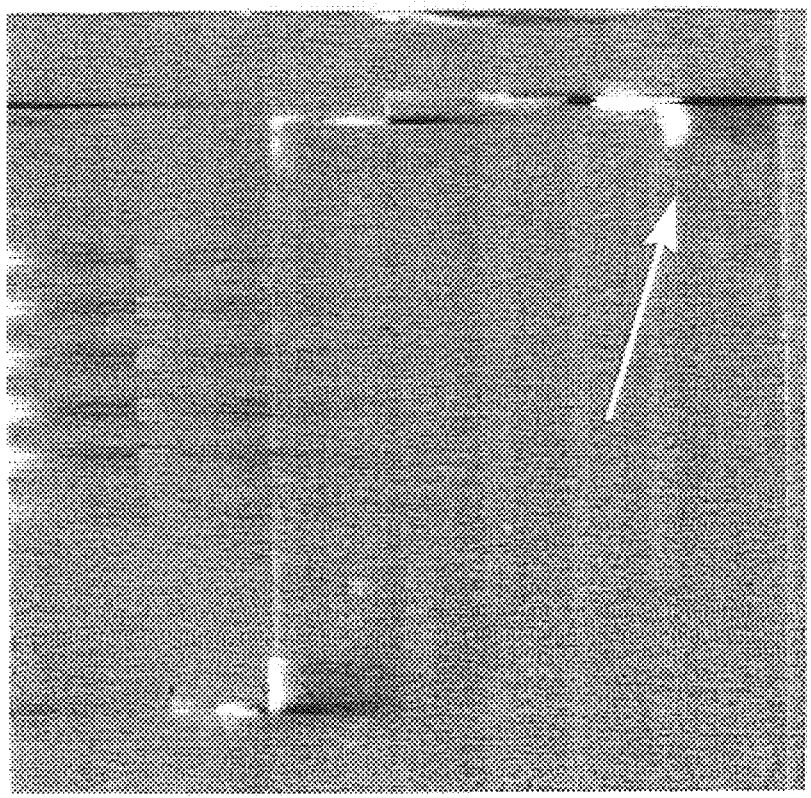
FIG. 5a shows an image of an open-circuit defect in another CMOS IC obtained with the TIVA apparatus using substrate-side irradiation.
Figure 5B:
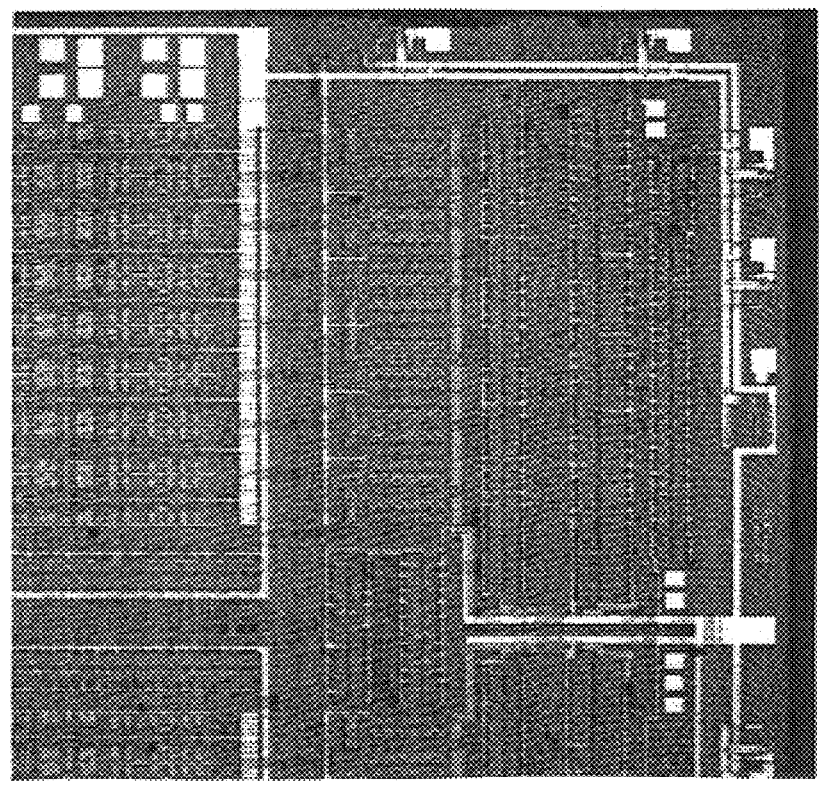
FIG. 5b shows a reflected-light image obtained through the substrate for the same scanned portion of the IC for registration.

FIGS. 5a and 5b show images obtained with the TIVA apparatus 10 of the present invention for substrate-side analysis of a low power CMOS application specific IC (ASIC) 100 fabricated using a 4-$\mu$m metal and 3-$\mu$m polysilicon process. For analysis, this IC 100 was operated at a constant current of 70 $\mu$A and a variable voltage of about 4.9 V. The laser 14 was operated at 1.34 $\mu$m wavelength and 120 mW power.

A simulated open-circuit defect in the form of a floating electrical conductor was produced using high-power laser ablation of metal from the conductor at a point or site in the IC 100 indicated by the arrow. Since this IC was packaged with the device side exposed (i.e. with the device side up), access to the substrate side of the IC was provided by potting the IC in epoxy and mechanically polishing away the bottom of the IC to expose the substrate side of the IC. Once the substrate-side of the IC 100 was exposed, no additional thinning of the IC substrate was performed.

In FIG. 5a, the TIVA apparatus 10 using the focused and scanned laser beam 16 provides an image (indicated in FIG. 5a by the connected light-colored lines against a darker background) of the open-circuit floating electrical conductor. The entire open-circuit or floating electrical conductor can be seen in FIG. 5a from the location of the open-circuit defect (indicated by the arrow) to a connection of the conductor to a gate of a driven transistor located at the bottom left-hand side of FIG. 5a. FIG. 5b shows a reflected-light image obtained through the substrate for the same portion of the IC 100 as shown in FIG. 4a for use in locating the open-circuit defect and floating conductor within the IC 100.

Figure 6A:
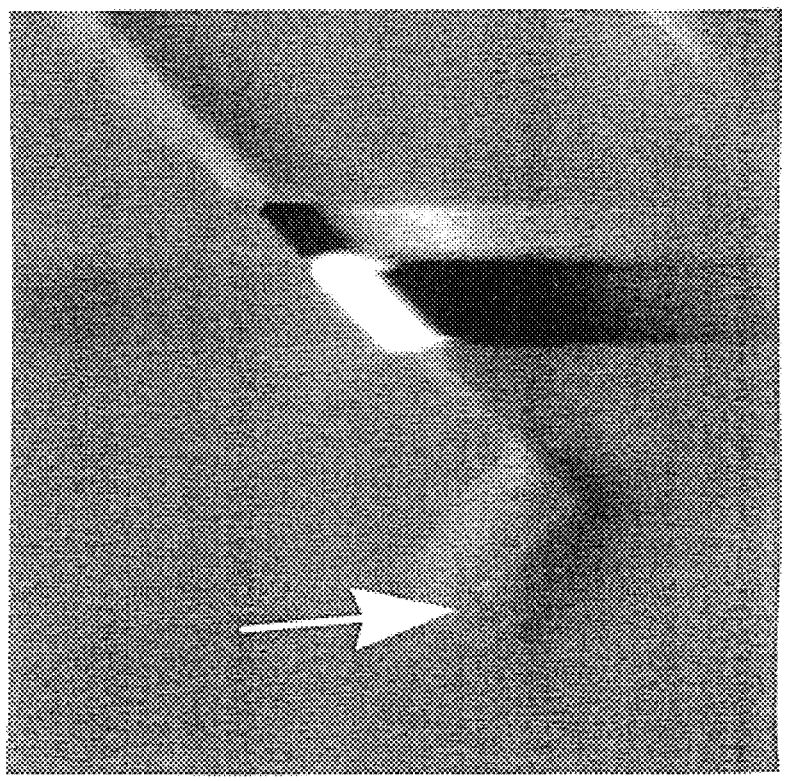
Figure 6B:
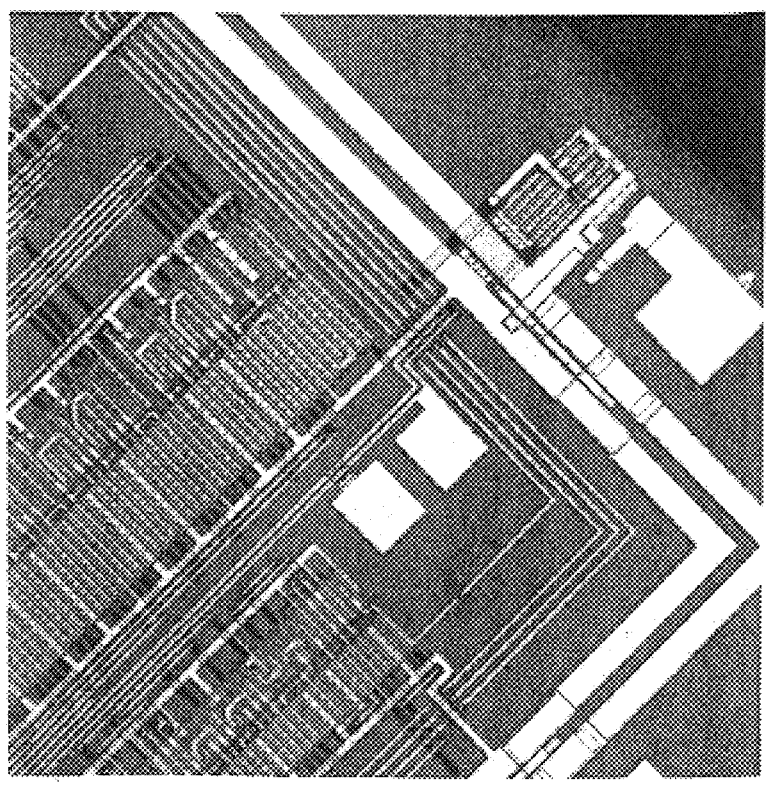
FIG. 6b shows the scanned portion of the IC containing the defect.

FIGS. 6a and 6b show at higher magnification (and rotated at a 45° angle) the open-circuit defect produced by laser ablation in FIGS. 5a and 5b, respectively. The biasing and laser irradiation conditions for the IC 100 in FIGS. 6a and 6b are the same as those of FIGS. 5a and 5b. The TIVA image of the open-circuit defect in FIG. 6a using substrate-side irradiation was produced by averaging 4 images, with each image being formed by scanning over each line in the image 16 times to improve a signal-to-noise ratio of the image. The signal acquisition time for each 512 line image (with 512 pixels per line) was 512 seconds (4 images averaged×128 seconds/image or repetitively scanning each line in the image 16 times). In the absence of line averaging, typical scan times for each image can range from about 4 to 8 seconds.

In FIG. 6a, the contrast of the TIVA image of the open-circuit floating electrical conductor can be seen to be affected by the amount of localized heating produced by the focused laser beam 16. The bright (i.e. white) portion of the TIVA image in FIG. 6a with a high contrast is produced where the electrical conductor is thermally insulated from the underlying substrate by a layer of insulating field oxide (i.e. silicon dioxide) and a p-well region of transistor logic gates. The irradiation by the focused laser beam 16 produces an increased localized heating of the thermally insulated portion of the conductor, thereby producing a larger thermoelectric potential and an increase in the amplified voltage signal 50 as compared to the remaining portion of the conductor which is in thermal contact with the underlying substrate. Additionally, absorption of the focused laser beam 16 by the silicon substrate adjacent to the open-circuit floating conductor locally heats the silicon substrate with the heating being transferred laterally to the conductor which is in thermal contact with the substrate. With no intervening structures (i.e. transistors) to absorb the heat, this results in heating of the floating electrical conductor by lateral heat transfer, thereby broadening the TIVA image of the open-circuit floating conductor. This effect is most pronounced in FIG. 6a near the open-circuit defect as indicated by the arrow.

Figure 7A:
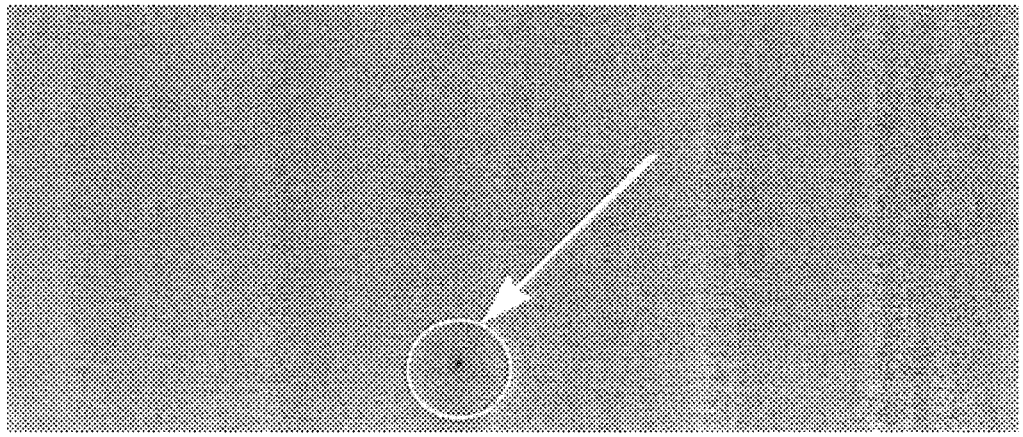
FIG. 7a shows a device-side TIVA image of an entire 1 Mb SRAM IC with the location of a short-circuit defect indicated by the arrow and circle.
Figure 7B:
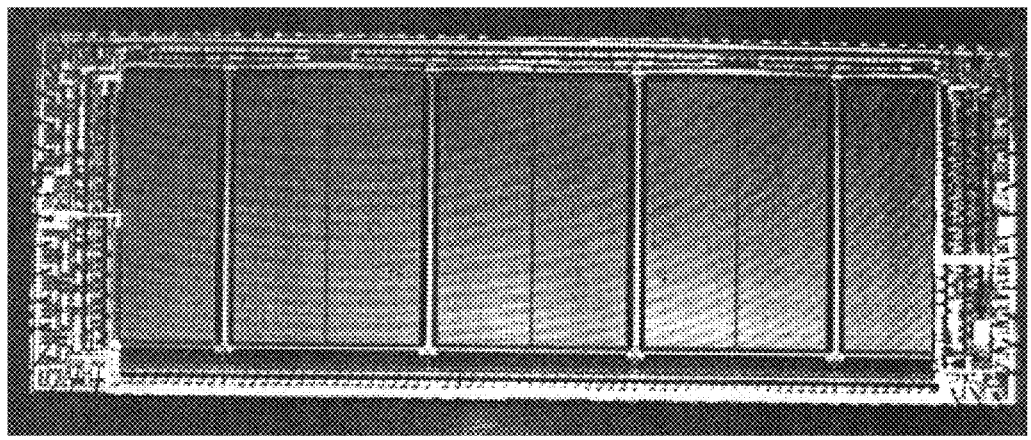
FIG. 7b shows a reflected-light image of the SRAM IC.

FIGS. 7a and 7b show the utility of the present invention for analyzing an entire IC die in a single image for qualification testing or failure analysis. FIGS. 7a and 7b show, respectively, a device-side TIVA image of an entire 3-level metal, 0.5-$\mu$m feature size, 1 megabyte (Mb) static random access memory (SRAM) IC 100, and a reflected-light image of the IC 100. For analysis, this IC 100 was biased at a constant current of 15 mA and a variable voltage of about 4.9 V, with the laser 14 being operated at 1.34 $\mu$m wavelength with 120 mW of power. The TIVA apparatus 10 was used to locate a short-circuit defect within the SRAM IC 100 as shown in FIG. 7a by the dark spot indicated by the white circle and arrow. Once the short-circuit defect has been located by scanning the entire SRAM IC 100, a smaller portion of the IC can be scanned to precisely locate the defect.

Figure 8A:
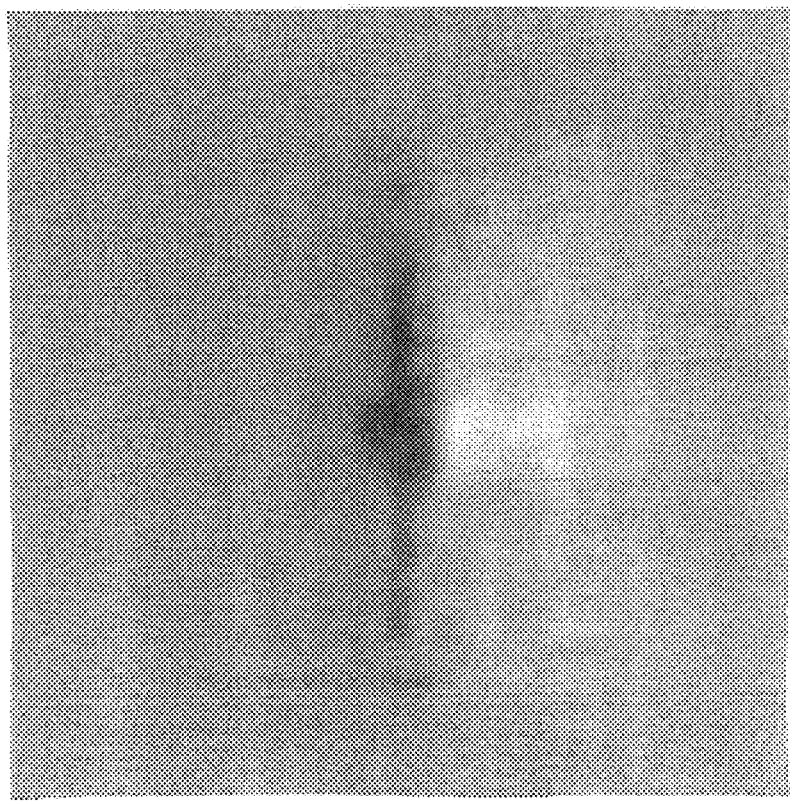
Figure 8B:
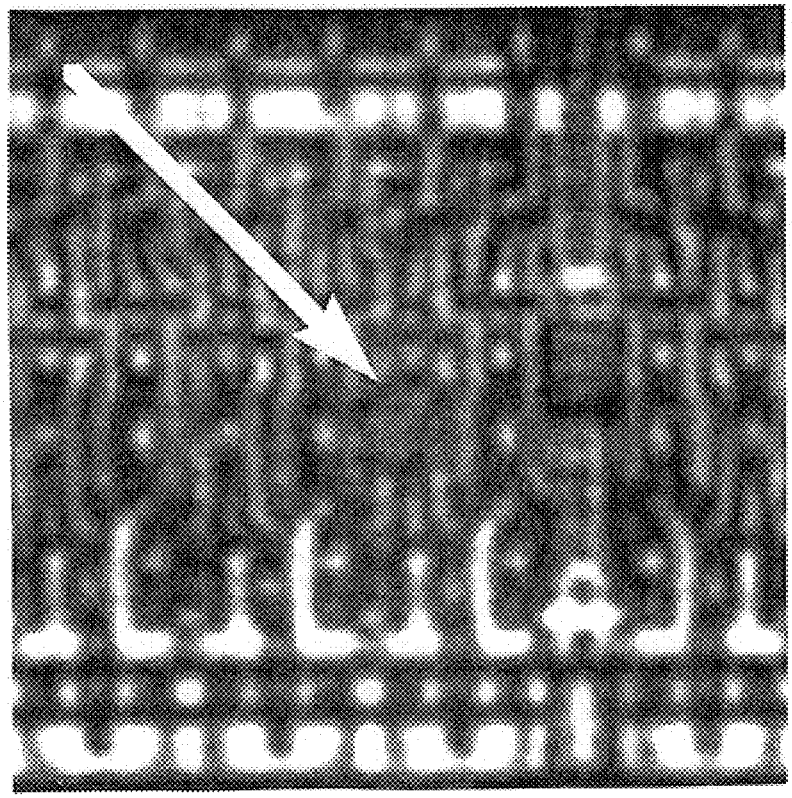
FIG. 8b shows a corresponding reflected-light image of that portion of the IC showing the defect.

FIG. 8a shows an enlarged TIVA image of the portion of the SRAM IC 100 surrounding the short-circuit defect in FIG. 7a; and FIG. 8b shows a corresponding reflected-light image of the same portion of the IC 100 for registration. The operating conditions for FIGS. 8a and 8b are the same as those of FIGS. 7a and 7b. A blurring of the reflected-light image in FIG. 8b is due to the focused and scanned laser beam 16 which has a wavelength of 1.34 $\mu$m that is substantially larger than the 0.5-$\mu$m feature size of the SRAM IC 100 being tested. Once the location of the short-circuit defect was determined using the TIVA apparatus 10, the short-circuit defect was determined to be a stainless steel particle (indicated by the arrow in FIG. 8b) that was shorting two adjacent signal lines.

Figure 9A:
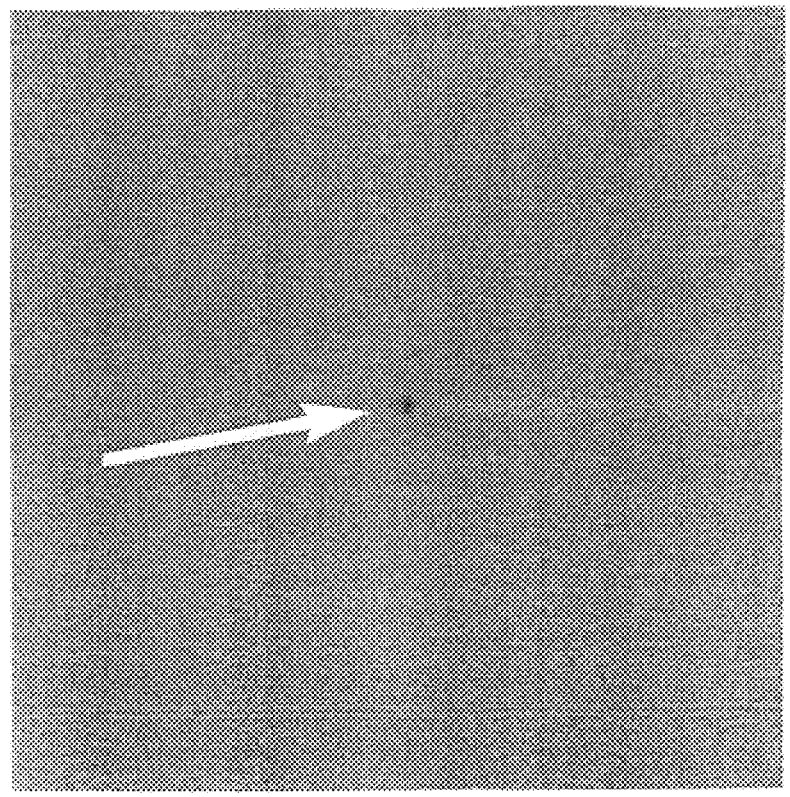
FIGS. 9a and 9b show, respectively, a device-side TIVA image and a corresponding reflected-light image of another 1 Mb SRAM IC for locating a short-circuit defect therein.

FIG. 9a shows a device-side TIVA image of another 1 Mb SRAM IC 100 biased at a constant current of 4 mA and a variable source voltage near 4.6 volts. The variation in the supply voltage ($V_{DD}$) indicating the location of a short-circuit defect in FIG. 9a was about 0.3 mV before amplification. This voltage change was produced with the focused and scanned laser beam 16 from the 120 mW, 1.34 µm laser 14. The particle responsible for the short-circuit defect can be clearly seen in the corresponding reflected-light image in FIG. 9b, although the individual electrical conductors short-circuited by the particle are not resolved. The short-circuiting particle was also found to be a stainless steel particle that bridged across adjacent conductors in the IC 100.

Figure 9B:
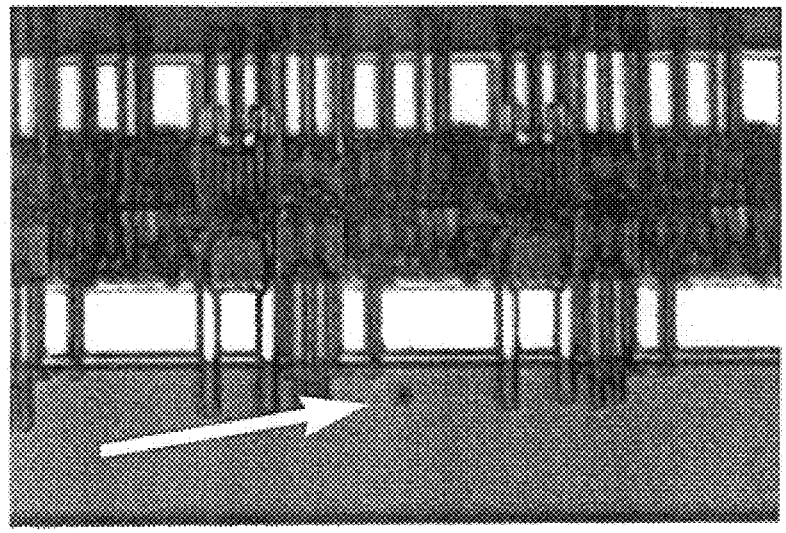
Figure 9B:
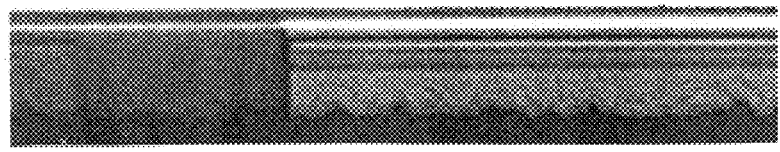
Figure 10A:
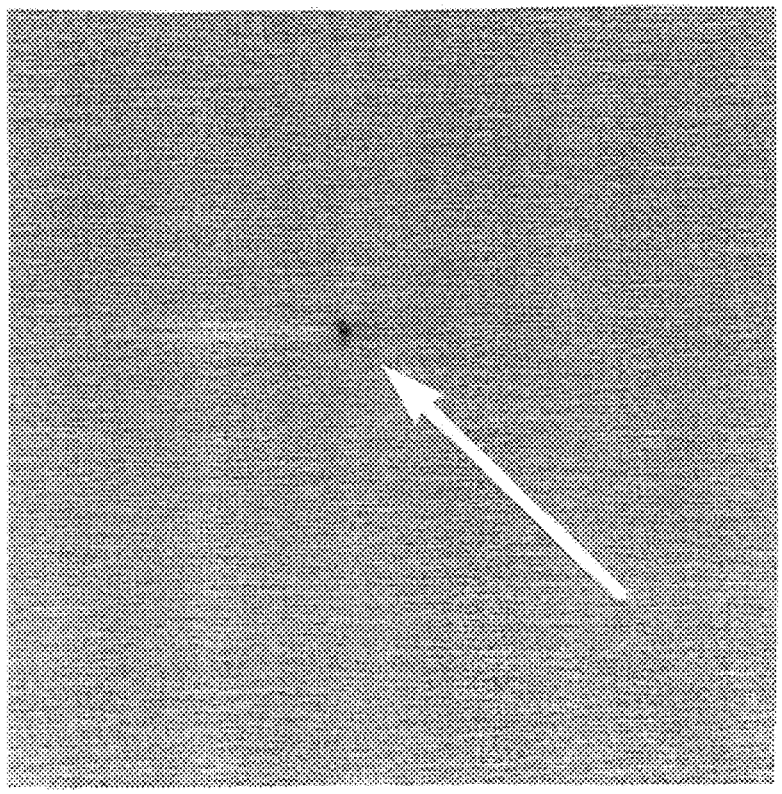
FIGS. 10a and 10b show, respectively, a TIVA image and a reflected-light image of the SRAM IC of FIGS. 9a and 9b using substrate-side irradiation with the TIVA apparatus and method of the present invention.
Figure 10B:
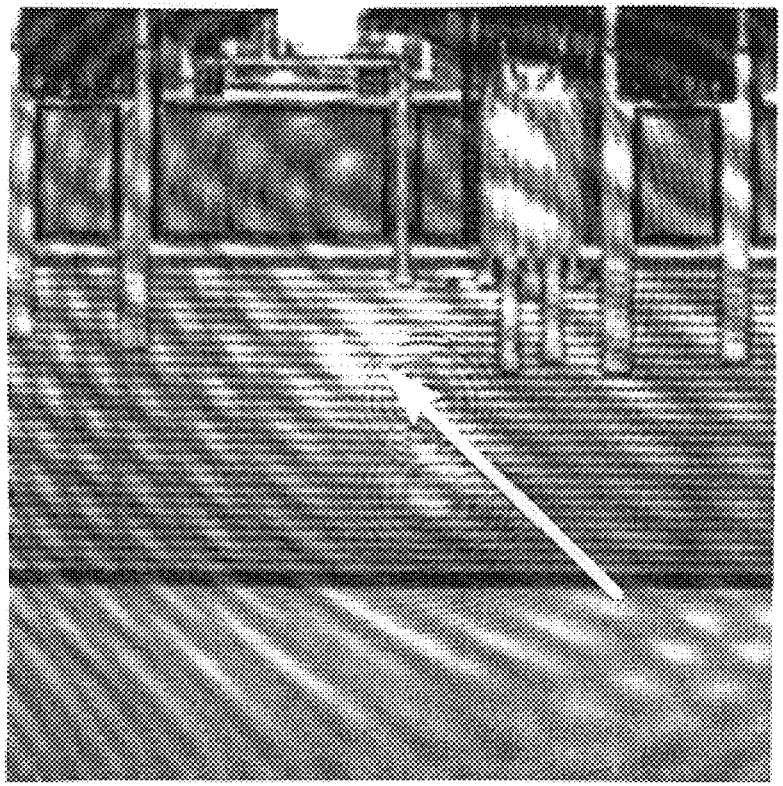

FIGS. 10a and 10b show, respectively, a TIVA image and a reflected-light image of the same SRAM IC 100 and short-circuit defect of FIGS. 9a and 9b at higher magnification using substrate-side irradiation with the focused and scanned laser beam 16. In FIGS. 10a and 10b, the same biasing and laser operating conditions were used as for FIGS. 9a and 9b. The SRAM IC 100 was prepared for substrate-side TIVA analysis by sealing the device side of the IC with epoxy and then exposing the substrate side of the IC 100 by mechanical polishing. In FIG. 10a, the short-circuit defect is located using substrate-side irradiation; and its location is pinpointed by the arrow. The reflected-light image in FIG. 10b is at higher magnification, and also has been contrast enhanced by the image processor 32 so that the individual electrical conductors can be identified. In FIG. 10b, the short-circuiting particle is not visible since it is located beneath the electrical conductors.

The variation in voltage of the constant-current source 22 produced by the focused and scanned laser beam 16 can be further increased by increasing the laser beam power above the 120 mW used for the foregoing examples. Additionally, in some embodiments of the present invention, the laser 14 can be modulated or pulsed (e.g. at a 1 MHz pulse repetition rate produced, for example, by positioning an electro-optic or acousto-optic modulator in the path of the laser beam 16 or within the laser 14) to produce the localized heating within the IC 100 being tested. The use of a modulated or pulsed laser beam 16 is advantageous in that it further allows the use of lock-in amplification or gated detection techniques to process the variation in supply voltage from the constant-current source 22, thereby further improving a signal-to-noise ratio in the image produced by the TIVA apparatus 10.

The matter set forth in the foregoing description and accompanying drawings is offered by way of illustration only and not as a limitation. Other applications and variations of the thermally-induced voltage alteration apparatus and method will become evident to those skilled in the art. The actual scope of the invention is intended to be defined in the following claims when viewed in their proper perspective based on the prior art.

What is claimed is:

1. An apparatus for analyzing an integrated circuit (IC) formed on a semiconductor substrate, comprising:
   (a) a constant-current source connected to the IC to supply a constant current and a variable voltage thereto, the voltage provided by the constant-current source to the IC changing in response to a change in a power demand by the IC;
   (b) a laser producing a beam with a photon energy less than a bandgap energy of the semiconductor substrate;
   (c) means for focusing and scanning the laser beam to irradiate electrical conductors within the IC and thereby change the power demand by the IC when the laser beam irradiates any open-circuit or short-circuit defect in the IC, the focusing and scanning means providing a position signal to indicate the location of the laser beam on the IC; and
   (d) display means comprising inputs of the changing voltage and the position signal for indicating the location of each open-circuit or short-circuit defect in the IC.

2. The apparatus in claim 1 further comprising a stage for holding the IC.

3. The apparatus in claim 2 wherein the stage comprises means for heating or cooling the IC.

4. The apparatus in claim 1 wherein the photon energy of the laser is less than 1.1 electron volts (eV).

5. The apparatus in claim 1 wherein the laser beam has a wavelength in the range of 1.2 microns to 2.5 microns.

6. The apparatus in claim 5 wherein the laser is a neodymium:yttrium-vanadium-oxide laser.

7. The apparatus in claim 6 wherein the wavelength of the laser beam is 1.34 microns.

8. The apparatus in claim 1 further comprising a photodetector for detecting a portion of the laser beam reflected or scattered from the IC.

9. The apparatus in claim 8 wherein the photodetector is a germanium photodetector.

10. The apparatus in claim 8 wherein the display means further includes an input from the photodetector to generate a reflected-light image of the IC.

11. The apparatus in claim 10 wherein the display means provides the reflected-light image superposed with an image of the open-circuit or short-circuit defect.

12. The apparatus in claim 1 further comprising a voltage amplifier, connected between the constant-current source and the display means, for amplifying the changing voltage.

13. The apparatus in claim 12 wherein the voltage amplifier is an ac-coupled voltage amplifier.

14. The apparatus in claim 1 further comprising a switch matrix connected between the constant-current source and the IC for controlling a plurality of electrical connections to the IC.

15. The apparatus in claim 14 wherein the switch matrix is computer controlled.

16. The apparatus in claim 1 wherein the laser beam irradiates the electrical conductors from a device side of the IC.

17. The apparatus in claim 1 wherein the laser beam is transmitted through the semiconductor substrate to irradiate the electrical conductors.

18. The apparatus in claim 1 further comprising an optical filter placed in a path of the laser beam to remove any light having a photon energy equal to or greater than the bandgap energy of the semiconductor substrate.

19. The apparatus in claim 1 wherein the semiconductor substrate comprises silicon.

20. The apparatus in claim 1 wherein the display means further comprises an image processor.

21. The apparatus in claim 1 wherein the means for focusing and scanning the laser beam comprises a scanning optical microscope.

22. An apparatus for analyzing an integrated circuit (IC) formed on a semiconductor substrate, comprising:
   (a) a stage for holding the IC and making electrical connections thereto;
   (b) a laser generating a laser beam with a photon energy less than a bandgap energy of the semiconductor substrate;

(c) means for focusing and scanning the laser beam onto the IC to irradiate electrical conductors within a portion of the IC and thereby produce by localized heating a thermoelectric potential at the location of any open-circuit defect in the electrical conductors; and (d) a constant-current source connected to the stage to supply power to the IC, the constant-current source further comprising a voltage that changes in response to the thermoelectric potential produced at the location of the open-circuit defect, the change in voltage thereby indicating the location of the open-circuit defect in the IC.

23. An apparatus for analyzing an integrated circuit (IC) formed on a semiconductor substrate, comprising:

(a) a stage for holding the IC and making electrical connections thereto;

(b) a laser generating a laser beam with a photon energy less than a bandgap energy of the semiconductor substrate;

(c) means for focusing and scanning the laser beam onto the IC to irradiate a short-circuit defect within the IC and thereby produce by localized heating a change in resistance of the short-circuit defect; and (d) a constant-current source connected to the stage to supply power to the IC, the constant-current source further comprising a voltage that changes in response to the change in resistance of the short-circuit defect, thereby indicating the location of the short-circuit defect in the IC.

24. A method for analyzing an integrated circuit (IC), comprising steps for:

(a) supplying electrical power to the IC from a constant-current source having a constant current and a variable voltage that changes in response to a change in a power demand by the IC;

(b) irradiating electrical conductors within the IC by focusing and scanning a laser beam over a portion of the IC thereby changing the power demand by the IC, the laser beam having a photon energy less than a bandgap energy of a semiconductor substrate wherefrom the IC is formed; and (c) detecting at least one open-circuit or short-circuit defect within the IC by sensing a position of the focused and scanned laser beam and a change in the variable voltage from the constant-current source.

25. The method of claim 24 wherein the step for detecting the open-circuit or short-circuit defect within the IC further comprises forming an image showing the location of the defect in the IC.

26. The method of claim 25 further including steps for forming a reflected-light image of the IC and superposing the reflected light-image with the image of the defect thereby forming a composite image for locating the defect in the IC.

27. The method of claim 26 wherein the reflected-light image is generated by detecting a portion of the laser beam reflected or scattered from the IC.

28. The method of claim 27 wherein the detecting step comprises detecting the portion of the laser beam reflected or scattered from the IC with a germanium photodetector.

29. The method of claim 24 further comprising a step for holding the IC and making a plurality of electrical connections thereto.

30. The method of claim 29 further comprising a step for controlling the electrical connections to the IC with a switch matrix.

31. The method of claim 30 wherein the switch matrix is computer controlled.

32. The method of claim 24 further comprising a step for amplifying the change in the variable voltage prior to the detecting step.

33. The method of claim 32 wherein the step for amplifying the change in the variable voltage is performed with an ac-coupled amplifier.

34. The method of claim 24 wherein the photon energy of the laser beam is less than 1.1 electron volts (eV).

35. The method of claim 24 wherein the laser beam has a wavelength in the range of 1.2 microns to 2.5 microns.

36. The method of claim 24 wherein the laser beam is generated by a neodymium:yttrium-vanadium-oxide laser.

37. The method of claim 36 wherein the a wavelength of the laser beam is 1.34 microns.

38. The method of claim 24 wherein the step of irradiating electrical conductors within the IC comprises irradiating a device side of the IC.

39. The method of claim 24 wherein the step of irradiating electrical conductors within the IC comprises transmitting the laser beam through the semiconductor substrate.

40. The method of claim 24 further including a step for filtering the laser beam and thereby removing any portion of the laser beam having a photon energy greater than or equal to the bandgap energy of the semiconductor substrate.

* * * * *